(12) United States Patent
Ishii et al.

(10) Patent No.: US 8,759,785 B2
(45) Date of Patent: Jun. 24, 2014

(54) DETECTION APPARATUS AND RADIATION DETECTION SYSTEM

(75) Inventors: Takamasa Ishii, Honjo (JP); Chiori Mochizuki, Sagamihara (JP); Minoru Watanabe, Honjo (JP); Jun Kawanabe, Kodama-gun (JP); Kentaro Fujiyoshi, Kumagaya (JP); Hiroshi Wayama, Honjo (JP)

(73) Assignee: Canon Kabushiki Kaisha, Tokyo (JP)

( * ) Notice: Subject to any disclaimer, the term of this patent is extended or adjusted under 35 U.S.C. 154(b) by 443 days.

(21) Appl. No.: 13/195,535

(22) Filed: Aug. 1, 2011

(65) Prior Publication Data

US 2012/0032088 A1    Feb. 9, 2012

(30) Foreign Application Priority Data

Aug. 5, 2010  (JP) ................. 2010-176365

(51) Int. Cl.
*G01T 1/24*         (2006.01)

(52) U.S. Cl.
CPC .. *G01T 1/242* (2013.01); *G01T 1/24* (2013.01)
USPC .................. 250/370.14; 250/208.2; 250/394

(58) Field of Classification Search
CPC ........... G01T 1/24; G01T 1/242; G01T 1/249; G01T 1/362; G01T 1/2928; G01J 9/00; G01J 1/4228; H04N 5/32
USPC ................................. 250/370.14, 394, 208.2
See application file for complete search history.

(56) References Cited

U.S. PATENT DOCUMENTS

| | | | |
|---|---|---|---|
| 2007/0007458 A1 | 1/2007 | Mochizuki et al. | |
| 2007/0045556 A1 | 3/2007 | Watanabe et al. | |
| 2009/0004768 A1* | 1/2009 | Watanabe et al. | ............... 438/64 |
| 2009/0052624 A1* | 2/2009 | Mochizuki et al. | ........... 378/98.8 |
| 2009/0127435 A1* | 5/2009 | Mochizuki et al. | ......... 250/208.1 |
| 2012/0080600 A1* | 4/2012 | Fujiyoshi et al. | ............. 250/369 |
| 2012/0080605 A1* | 4/2012 | Kawanabe et al. | ...... 250/370.08 |

FOREIGN PATENT DOCUMENTS

| | | |
|---|---|---|
| CN | 1925162 A | 3/2007 |
| CN | 101218679 A | 7/2008 |
| JP | H06318589 A | 11/1994 |
| JP | H0964182 A | 3/1997 |
| JP | 2002-076360 A1 | 3/2002 |
| JP | 2007049124 A | 2/2007 |
| JP | 2008244445 A | 10/2008 |
| JP | 2010003820 A | 1/2010 |

* cited by examiner

*Primary Examiner* — David Porta
*Assistant Examiner* — Gisselle Gutierrez
(74) *Attorney, Agent, or Firm* — Canon USA Inc. IP Division

(57) ABSTRACT

A stacked-type detection apparatus including a plurality of pixels arranged at small intervals is configured to have low capacitance associated with signal lines and/or driving lines. With this novel configuration, small time constant and high-speed driving capability can be achieved in the signal lines and/or driving lines. The plurality of pixels in the detection apparatus are arranged in a row direction and a column direction on an insulating substrate. Each pixel includes a conversion element and a switch element, the conversion element is disposed above the switch element. A driving line disposed below the conversion elements is connected to switch elements arranged in the row direction, and a signal line is connected to switch elements arranged in the column direction. The signal line includes a conductive layer embedded in an insulating member, the insulating member is disposed in a layer lower than an uppermost surface portion of the driving line.

11 Claims, 8 Drawing Sheets

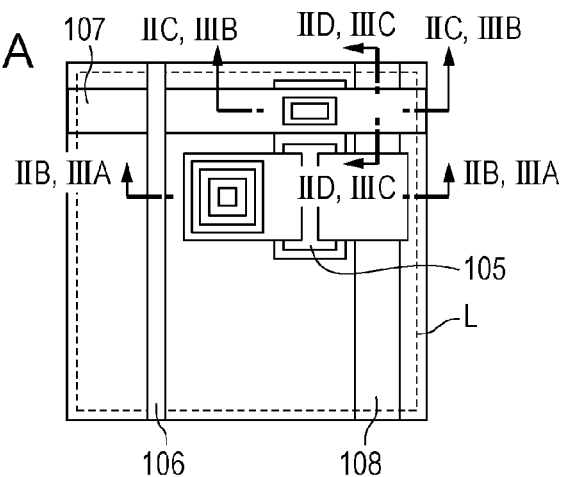
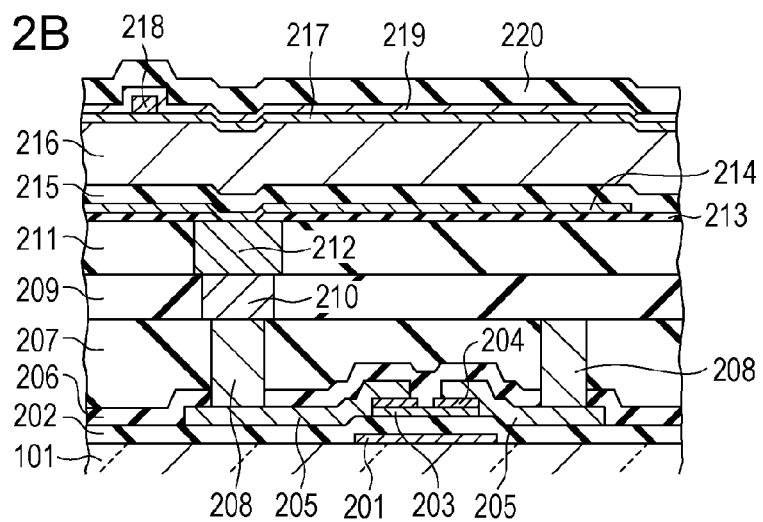
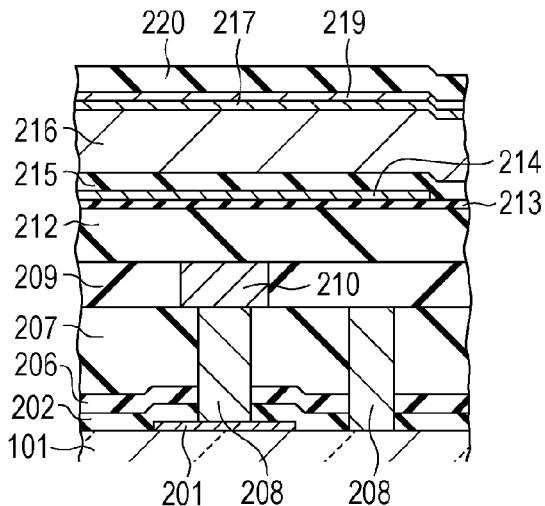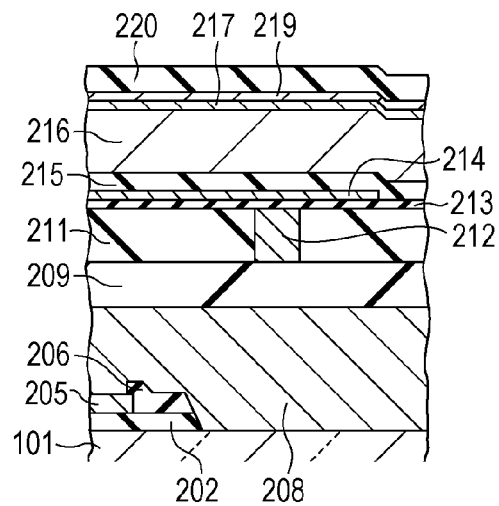

DETECTION APPARATUS AND RADIATION DETECTION SYSTEM

BACKGROUND OF THE INVENTION

1. Field of the Invention

The present invention relates to a detection apparatus applicable to a medical diagnostic imaging apparatus, a non-destructive testing apparatus, an analysis apparatus using radiation, or the like, and also relates to a radiation detection apparatus and a radiation detection system equipped with a radiation detection apparatus.

2. Description of the Related Art

In recent years, advances in semiconductor technology have enabled the mass production of large-sized radiation sensors. The semiconductor building blocks of a modern radiation sensor (radiation detection apparatus) include a conversion element such as a photoelectric conversion element and a switch element such as a thin film transistor (TFT). To form a radiation detection apparatus such as a medical X-ray detection apparatus, these semiconductor building blocks may be combined with a fluorescent member (scintillator) and arranged in one- or two-dimensional arrays of pixels that perform wavelength conversion, i.e., convert radiation such as an X-ray into visible light or the like.

In general, the pixel structure used in the radiation detection apparatus can be classified into two types, i.e., a single-plane type in which a conversion element and a switch element are disposed in the same plane and a stacked type in which a conversion element is disposed above a switch element. In the production of the single-plane type, the conversion element and the switch element can be produced using the same semiconductor production process, which allows simplification of the production process. In the case of the stacked-type detection apparatus, the provision of the conversion element above the switch element makes it possible to increase the size of the conversion element in each pixel compared with the single-plane type. Therefore, the stacked-type detection apparatus is capable of providing a larger signal, a higher signal-to-noise ratio, and a higher sensitivity than can be provided by the single-plane type detection apparatus.

In radiation detection apparatuses, in particular in medical X-ray detection apparatuses, there is a need for a reduction in the amount of radiation a patient is exposed to. To meet this requirement, it is important to achieve a sensor having higher sensitivity and high signal-to-noise (S/N) ratio. In a sensor, noise is generated by many sources. Devices/elements that can be noise sources include conversion elements, switch elements, signal lines, integrating amplifiers, and peripheral circuits. Hereinafter, noise generated by a signal line will be referred to as signal line noise. When a signal line has parasitic capacitance C, the signal line noise is given by a following equation.

$$\text{signal line noise} = \sqrt{kTc}$$

Hereinafter, noise generated by an integrating amplifier will be referred to as amplifier noise. In a case where an integrating amplifier with feedback capacitance Cf is used as a charge reading amplifier, the amplifier noise is given by the following equation.

$$\text{amplifier noise} = C/Cf \times \text{noise at amplifier input}$$

Therefore, a reduction in parasitic capacitance C of the signal line is effective to reduce noise of the detection apparatus. That is, to achieve high sensitivity, it is effective to reduce noise by reducing the parasitic capacitance of the signal line.

In the detection apparatus, there is also a need for an increase in driving speed. When a driving line via which a driving pulse is supplied to control turning-on/off of a switch element has capacitance Cg and resistance Rg, the time constant τ of this driving line is given by the following equation.

$$\tau = Cg \times Rg$$

Thus, if the capacitance and/or the resistance of the driving line increases, the time constant τ of the driving line increases, which can cause a driving pulse transmitted via the driving line to become dull or distorted. Therefore, if the turn-on period of the switch element is reduced, the dullness can make it difficult for the switch element to be in an on-state for a designed necessary period. That is, the dullness makes it difficult to reduce the turn-on period, which makes it difficult to increase the driving speed.

Japanese Patent Laid-Open No. 2002-76360 discloses a technique to realize a single-plane type radiation detection apparatus with signal/driving lines (hereinafter, referred to simply as lines) having reduced resistance. U.S. Patent Application Publication No. 2007/0045556 proposes a technique to reduce resistance of a line in a stacked type radiation detection apparatus.

In conventional radiation detection apparatuses, therefore, there is a need for a reduction in pixel pitch, an increase in the number of pixels, an increase in sensitivity, and an increase in driving speed regardless of whether the pixel structure in these radiation detection apparatuses is of the single-plane type or the stacked-type. In particular, since medical X-ray detection apparatuses include various types of detection apparatuses such as an X-ray mammography apparatus, an X-ray transmission detecting apparatus capable of taking a moving image, etc., a reduction in pixel pitch and an increase in the number of pixels specific to each of these various types of medical X-ray apparatuses are highly desirable.

SUMMARY OF THE INVENTION

In view of the current state of the art, one object of the present invention is to provide a technique for reducing noise by a reduction in signal line capacitance and an increasing driving speed by a reduction in time constant associated with a driving line in a detection apparatus, in particular in a stacked-type detection apparatus with a greater number of pixels arranged at smaller intervals.

In one aspect, the present invention discloses a detection apparatus including a plurality of pixels arranged in a row direction and a column direction on an insulating substrate, wherein each pixel includes a conversion element configured to convert radiation or light into an electric charge, and a switch element disposed on the insulating substrate and configured to output an electric signal corresponding to the electric charge and wherein the conversion element is disposed above the switch element. A driving line disposed below the conversion elements is connected to each of the switch elements arranged in the row direction, and a signal line is connected to each of the switch elements arranged in the column direction. The signal line includes a conductive layer embedded in an insulating member, the insulating layer is formed in a layer located lower than an uppermost surface portion of the driving line.

Further features of the present invention will become apparent from the following description of exemplary embodiments with reference to the attached drawings.

BRIEF DESCRIPTION OF THE DRAWINGS

FIG. 2A is a plan view of a pixel of a detection apparatus according to the first embodiment of the present invention, and FIGS. 2B to 2D are cross-sectional views thereof.

DESCRIPTION OF THE EMBODIMENTS

Figure 1:
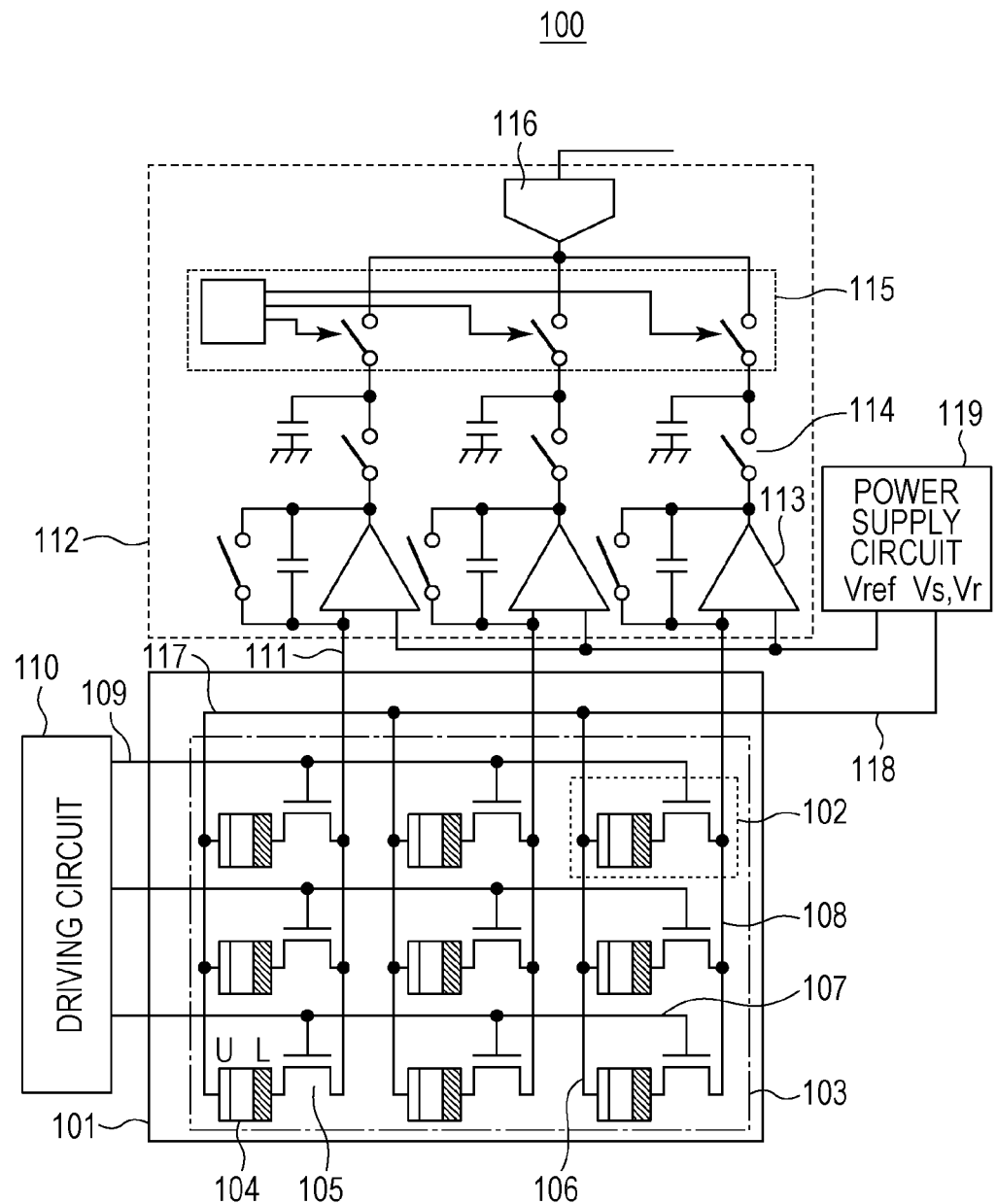
FIG. 1 illustrates a conceptual circuit diagram of a detection apparatus according to a first embodiment of the present invention.

The present invention is described in further detail below with reference to embodiments in conjunction with the accompanying drawings. In the present description, the term "radiation" is used to describe various kinds of radiations including particle beams such as an alpha ray, a beta ray, a gamma ray, etc., radiated via radioactive decay, and other beams with high energy similar to that of such particle beams. For example, an X-ray, a cosmic ray, etc., fall in the scope of radiations. Furthermore, in the present description, the conversion element refers to a semiconductor device configured to convert a radiation or light into an electric signal (electric charge).

First Embodiment

A radiation detection apparatus according to a first embodiment is described below with reference to drawings.

Referring to FIG. 1 and FIGS. 2A to 2D, a radiation detection apparatus 100 according to the first embodiment includes an insulating substrate 101 such as a glass substrate and a pixel region 103 formed on the insulating substrate 101. In the pixel region 103, a plurality of pixels 102 are arranged in row and column directions. That is, the plurality of pixels 102 are arranged in a matrix. Each pixel 102 includes a conversion element 104 configured to convert radiation or light incident thereupon into an electric charge, and a switch element 105 configured to output an electric signal corresponding to the electric charge provided by the conversion element 104. In the present embodiment, a metal-insulator-semiconductor (MIS)-type photoelectric conversion element is used as the conversion element, and a thin film transistor (TFT) is used as the switch element. In a case where the conversion element is designed to convert radiation into an electric charge, a fluorescent member is disposed on a radiation-incident side of the photoelectric conversion element to convert the radiation into visible light that can be detected by the photoelectric conversion element. A first electrode L of the conversion element 104 is electrically connected to a first main electrode of the switch element 105, and a second electrode U of the conversion element 104 is electrically connected to a bias line 106. Note that the bias line 106 is electrically connected in common to the second electrode U of each of the conversion elements 104 arranged in the column direction. A control electrode of the switch element 105 is electrically connected to a driving line 107, and a second main electrode of the switch element 105 is electrically connected to a signal line 108. Note that the driving line 107 is connected in common to the control electrode of each of the switch elements 105 arranged in a row direction, and also electrically connected to a driving circuit 110 via a first connection line 109. The driving circuit 110 is configured to sequentially or simultaneously supply driving pulses to a plurality of driving lines 107 arranged in the column direction whereby electric signals are output from pixels in units of rows in parallel to a plurality of signal lines 108 arranged in the row direction. Each signal line 108 is electrically connected in common to the second main electrodes of a plurality of switch elements 105 arranged in the column direction, and is also electrically connected to a reading circuit 112 via a second connection line 111. The reading circuit 112 includes integrating amplifiers 113 provided for the respective signal lines 105 and configured to provide an integrated and amplified value of the electric signals received via the signal lines 105, and sample-and-hold circuits configured to sample and hold the amplified electric signals provided by the integrating amplifier 113. The reading circuit 112 further includes a multiplexer 115 configured to convert the electric signals output in parallel from the sample-and-hold circuits into a series electric signal, and an analog-to-digital converter 116 configured to convert the output electric signal into digital data. A reference potential Vref is supplied from a power supply circuit 119 to a non-inverting input terminal of the reading circuit 112. The power supply circuit 119 is also electrically connected to a plurality of bias lines 106 arranged in the row direction via a common bias line 117 and a third connection line 118 to supply a bias potential Vs or an initialization potential Vr to the second electrodes U of the respective conversion elements 104.

Next, an operation of the detection apparatus according to the present embodiment is described below with reference to FIG. 1. The reference potential Vref is applied to the first electrode L of the conversion element 104 via the switch element and the bias potential Vs is applied to the second electrode U thereby biasing the conversion element 104 such that a photoelectric conversion layer of the MIS-type photoelectric conversion element is depleted. In this state, the radiation emitted toward an object under examination passes through the object while attenuating in intensity, and is converted into visible light by a fluorescent member (not shown). The resultant visible light is incident on the photoelectric conversion element and is converted into an electric charge. The electric signal corresponding to the electric charge is output over the signal line 108 when the switch element 105 turns on in response to the driving pulse applied from the driving circuit 110 to the driving line 107, and the electric signal is read out as digital data by the reading circuit 112. Thereafter, the potential of the bias line 106 is switched from the bias potential Vs to the initialization potential Vr and the switch element 105 is turned on to remove positive or negative residual carriers from the photoelectric conversion element. Thereafter, the potential of the bias line 106 is switched from the initialization potential Vr to the bias potential Vs to complete the initialization of the conversion element 104.

Referring to FIGS. 2A to 2D, a layer structure of one pixel is described below. Note that in FIG. 2A, for simplicity of illustration, the conversion element 104 is drawn in a simplified manner such that only the first electrode L thereof is drawn.

FIGS. 2B to 2D are cross-sectional views taken along lines IIB-IIB, IIC-IIC, and IID-IID, respectively. As shown in FIG. 2A, one pixel of the radiation detection apparatus according to the present embodiment includes the conversion element 104 serving as a photoelectric conversion element, the switch element 105 realized by a TFT, a part of the signal line 108, a part of the driving line 107, and a part of the bias line 106. As shown in FIGS. 2B to 2D, the TFT serving as the switch element 105 includes elements formed of a plurality of layers stacked on the insulating substrate 101. Specifically, stacked on the insulating substrate 101, the switch element 105 includes a first conductive layer 201, a first insulating layer 202, a first semiconductor layer 203, a first impurity semiconductor layer 204, and a second conductive layer 205. The first conductive layer 201 is used as a control electrode (gate electrode) of the TFT, and the first insulating layer 202 is used as a gate insulating film of the TFT. The first semiconductor layer 203 serves as a channel, the first impurity semiconductor layer 204 serves as an ohmic contact layer, and the second conductive layer 205 serves as a first or second main electrode (source or drain electrode) of the TFT.

On the layers described above, a second insulating layer 206 and a third insulating layer 207 are formed. A third conductive layer 208 serving as the signal line 108 is formed in the second insulating layer 206 and the third insulating layer 207. More specifically, the third conductive layer 208 is embedded in the second insulating layer 206 and the third insulating layer 207 such that the uppermost surface portion of the third conductive layer 208 is substantially flush with the uppermost surface portion of the third insulating layer 207 and such that the sum of the film thickness of the second insulating layer 206 and the film thickness of the third insulating layer 207 above the second conductive layer 205 is substantially equal to the film thickness of the third conductive layer 208. The second conductive layer 205 serving as the second main electrode of the switch element 105 is connected to the third conductive layer 208 serving as the signal line 108. Note that the "uppermost surface portion" refers to a surface area that is located, of any surface area of a conductive layer serving as a line or an insulating layer, closest to the conversion element.

A fourth insulating layer 209 is disposed above the third insulating layer 207 and the third conductive layer 208. A fourth conductive layer 210 is embedded in the fourth insulating layer 209 such that the uppermost surface portion of the fourth conductive layer 210 is substantially flush with the uppermost surface portion of the fourth insulating layer 209. That is, the film thickness of the fourth insulating layer 209 is substantially equal to the film thickness of the fourth conductive layer 210. A fifth insulating layer 211 is disposed above the fourth insulating layer 209 and the fourth conductive layer 210. A fifth conductive layer 212 used as the driving line 107 is embedded in a second insulating layer 211 having a film thickness substantially equal to the film thickness of the fifth conductive layer 212 such that the uppermost surface portion of the fifth conductive layer 212 is substantially flush with the uppermost surface portion of the fifth insulating layer 211. The fourth conductive layer 210 serves as a connection electrode that connects the second conductive layer 205 serving as the first main electrode of the switch element 105 to the sixth conductive layer 214 serving as the second electrode L of the conversion element 104. The fourth conductive layer 210 also serves as a connection electrode that connects the first conductive layer 201 serving as the control electrode of the switch element 105 to the fifth conductive layer 212 serving as the driving line 107.

A MIS-type photoelectric conversion element serving as the conversion element 104 is formed on a sixth insulating layer 213 disposed above the fifth conductive layer 212 and the fifth conductive layer 212. The MIS-type photoelectric conversion element includes a sixth conductive layer 214, a seventh insulating layer 215, a second semiconductor layer 216, a second impurity semiconductor layer 217, and an eighth conductive layer 219. The sixth conductive layer 214 serves as a lower electrode (first electrode L) of the photoelectric conversion element. The seventh insulating layer 215 serves as a perfect insulating layer for blocking positive and negative generated carriers from moving. The second semiconductor layer 216 serves as a photoelectric conversion layer that converts a radiation or light into an electric charge. The second impurity semiconductor layer 217 serves as a blocking layer that blocks positive or negative carriers from moving. The eighth conductive layer 219 serves as an upper electrode (second electrode U). The seventh conductive layer 218 serves as the bias line 106. The upper electrode (second electrode U) realized using the eighth conductive layer 219 serves to apply a bias voltage to the whole conversion element 104, wherein the bias voltage is equal to the difference between the bias potential Vs or the initialization potential Vr supplied via the bias line 106 and a reference potential Vref supplied to the first electrode L.

As described above, in the radiation detection apparatus according to the present embodiment, the switch element 105, the signal line 108, the gate line 107, the conversion element 104, and the bias line 106 are disposed on the insulating substrate 101. Above those, the eighth insulating layer 220, a protection layer (not shown), and a fluorescent member (not shown) are further disposed. One pixel is formed by these elements described above. That is, the radiation detection apparatus according to the present embodiment is of a stacked type in which the conversion element is located above the switch element.

In the present embodiment, as described above, the first main electrode and the second main electrode of the TFT serving as the switch element 105 are formed in a layer different from a layer in which the signal line 108 is formed, and the third conductive layer 208 serving as the signal line 108 is embedded in the second insulating layer 206 and the third insulating layer 207, which allows the third conductive layer 208 serving as the signal line to be formed with a large thickness. Thus, in the radiation detection apparatus, to reduce the pixel pitch and increase the number of pixels, the line width can be reduced without causing a significant increase in the resistance of the signal line 108. The signal line 108 has capacitance at a part at which the signal line 108 intersects the driving line 107 and also at a part at which the signal line 108 intersects the first electrode L of the conversion element 104. In the present embodiment, the small width of the signal line 108 results in a reduction in the overlapping area at each intersection, which leads to a reduction in capacitance at the intersection. The overlapping area between the signal line 108 and the first electrode L of the conversion element 104 is greater than the overlapping area between the signal line 108 and the driving line 107. Thus, to further reduce the capacitance of the signal line 108, the signal line 108 is realized by the third conductive layer 208 such that it is embedded in the second insulating layer 206 and the third insulating layer 207 which are insulating members located in a layer lower than the uppermost surface portion of the driving line 107 located below the conversion element 104 and such that the uppermost surface portion of the signal line 108 is located apart from the conversion element by a greater distance than the distance by which the uppermost surface portion of the driving line 107 is apart from the conversion element thereby achieving a reduction in the capacitance at the intersection between the signal line 108 and the conversion element. Furthermore, in the present embodiment, the fourth conductive layer 210 is embedded in the fourth insulating layer 209, and the fifth conductive layer 212 is embedded in the fifth insulating layer 211. This makes it possible to achieve a large thickness for the fourth insulating layer 209 disposed between the signal line 108 and the driving line 107, and a large thickness for the fourth insulating layer 209 and the fifth insulating layer 212 disposed between the signal line 108 and the first electrode L of the conversion element 104. Thus it is possible to reduce the capacitance at the intersection between the signal line 108 and the driving line 107 and the capacitance at the intersection between the signal line 108 and the first electrode L of the conversion element 104. Therefore, it is possible to reduce the pixel pitch and/or increase the number of pixels and the number of intersections between the signal line 108 and the driving line 107 or the conversion element 104 while maintaining low resistance and low capacitance for the signal line 108, which allows it to prevent an increase in noise due to the signal line capacitance. Furthermore, because it is allowed to reduce the line width of the signal line 108, it is possible to reduce the capacitance of the driving line 107 at the intersection between the signal line 108 and the driving line 107.

The control electrode of the TFT serving as the switch element 105 is realized by a conductive layer different from a conductive layer by which the driving line 107 is realized. Furthermore, because the fifth conductive layer 212 serving as the driving line 107 is embedded in the fifth insulating layer 211, it is possible to achieve an increased thickness for the fifth conductive layer 212 serving as the driving line 107, which makes it possible to reduce the resistance of the driving line 107 even in a case where a limitation on a layout does not allow an increase in the line width of the driving line 107. Furthermore, increasing in the thickness of the driving line 107 makes it possible to reduce the width of the driving line 107 without causing an increase in resistance. Thus it is possible to reduce the intersection area between the driving line 107 and the signal line 106 by reducing the width of the driving line 107. Thus, of the capacitance of the driving line 107, capacitance caused by the overlapping with the signal line can be reduced. Furthermore, it is possible to reduce the area of the intersection between the driving line 107 and the first electrode L by reducing the width of the driving line 107 although the distance between the driving line 107 and the first electrode L of the conversion element is also reduced. This makes it possible to prevent a significant increase in capacitance at the intersection between the driving line 107 and the first electrode L. Therefore, it is possible to reduce the pixel pitch and/or increase the number of pixels and the number of intersections between the driving line 107 and the signal line 108 or the conversion element 104 while maintaining low resistance and low capacitance for the driving line 107, which allows it to prevent an increase in time constant of the driving line.

As described above, the present embodiment makes it possible to achieve a stacked-type low-noise detection apparatus capable of being driven at a high speed.

Although only 3×3 pixels are shown in FIG. 1, a practical radiation detection apparatus may include as many pixels as, for example, 2000×2000 pixels or more. In the embodiment described above, the radiation detection apparatus is of the indirect type in which the photoelectric conversion element and the fluorescent member are combined, the present invention is not limited to this type. Similar advantages to those obtained in the embodiment described above can also be obtained for a radiation detection apparatus of a direct type in which the photoelectric conversion element is replaced with a conversion element including a semiconductor layer such as amorphous selenium disposed between electrodes and capable of directly converting an X-ray, a gamma ray or a particle beam such as an alpha ray or beta ray into an electric charge. Furthermore, the conversion element used in the radiation detection apparatus of the indirect type it not limited to the MIS-type photoelectric conversion element, but other types of photoelectric conversion elements such as a PIN-type photodiode may be used.

Second Embodiment

Figure 3A:
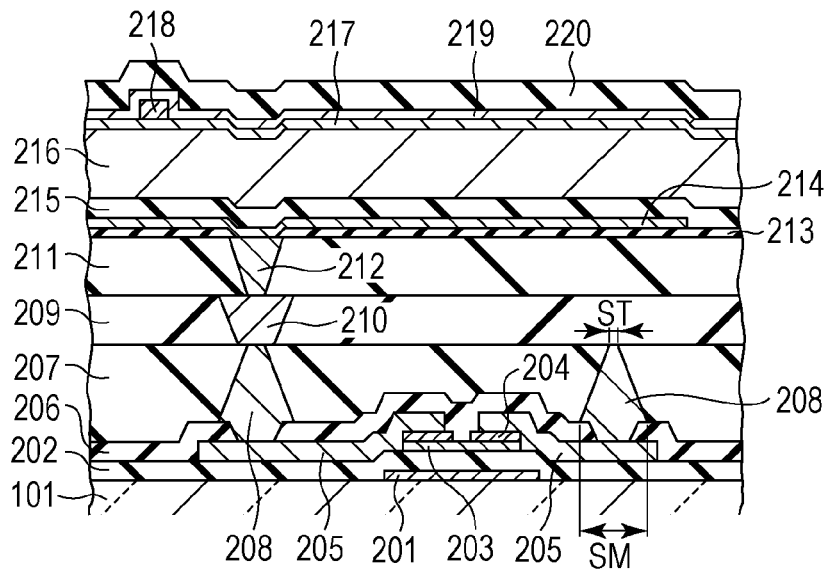
FIGS. 3A, 3B and 3C are cross-sectional views of a pixel of a detection apparatus according to a second embodiment of the present invention.
Figure 3B:
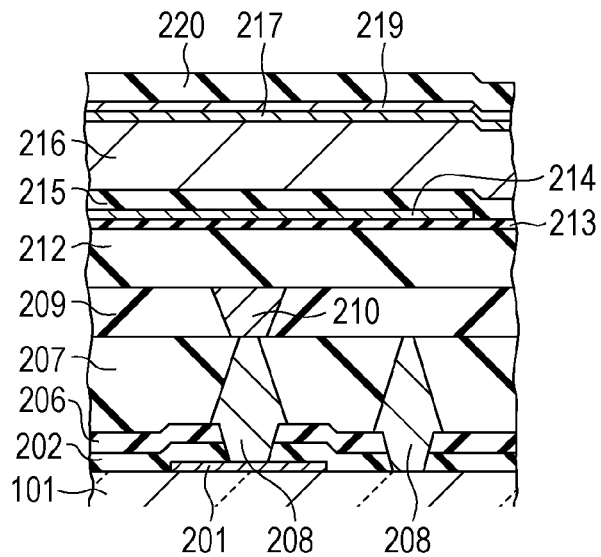
Figure 3C:
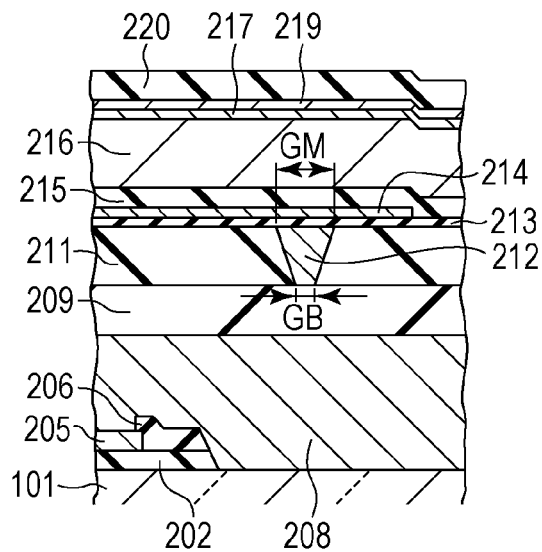

Second embodiment of the present invention is described below with reference to FIGS. 3A to 3C, which are cross-sectional views taken along lines IIIA-IIIA, IIIB-IIIB, and IIIC-IIIC, respectively. Similar elements to those in the first embodiment are denoted by similar reference numerals and a duplicated explanation thereof is omitted. In the present embodiment, the layer structure of each pixel is similar to that according to the first embodiment except that the third conductive layer 208 used as the signal line 108 and the fifth conductive layer 212 used as the driving line 107 are formed using the property of insulating layers so to have shapes different from those according to the first embodiment.

First, referring to FIGS. 3A to 3C, the shape of the third conductive layer 208 used as the signal line 108 is described below. The second insulating layer 206 is formed using an inorganic film, and the third insulating layer 207 is formed using an organic insulating film having negative-type photosensitivity. The inorganic film used as the second insulating layer 206 is formed first, and the organic insulating film used as the third insulating layer 207 is then formed. The organic insulating film is then patterned by light exposure to form the third insulating layer 207. Subsequently, the second insulating layer 206 is formed by etching the inorganic film using the third insulating layer 207 as an etching mask. Thereafter, a conductive film to be used as the third conductive layer 208 is formed, and unnecessary portions thereof is removed by a surface polishing process such that the third conductive layer 208 serving as the signal line 108 is formed in the second insulating layer 206 and the third insulating layer 208. In the configuration obtained via the above-described process, if the width of the upper part of the signal line 108 and the maximum width thereof are denoted by ST and SM, respectively, then ST<SM.

Next, the shape of the fifth conductive layer 212 used as the driving line 107 is described below. After the fourth insulating layer 209 and the fourth conductive layer 210 are formed, the fifth insulating layer 211 is formed. The fifth insulating layer 211 is formed using an organic insulating film having positive-type photosensitivity. After the organic insulating film is formed, the organic insulating film is patterned by light exposure so as to form the fifth insulating layer 211. Thereafter, a conductive film to be used as the fifth conductive layer 212 is formed, and unnecessary portions thereof is removed by a surface polishing process such that the fifth conductive layer 212 serving as the driving line 107 is formed in the fifth insulating layer 211. In the configuration obtained via the above-described process, if the width of the lower part of the driving line 107 and the maximum width thereof are denoted by GB and GM, respectively, then GB<GM.

By forming the signal line 108 to have a shape with line widths satisfying ST <SM as described above, it is possible to reduce the overlapping area between the signal line 108 and the driving line 107 or the overlapping area between the signal line 108 and the conversion element 104. Thus, the present embodiment makes it possible to further reduce the signal line capacitance compared with the first embodiment. By forming the driving line 107 to have a shape with line widths satisfying GB<GM as described above, it is possible to reduce the overlapping area between the signal line 108 and the driving line 107. Thus, the present embodiment makes it possible to further reduce the signal line capacitance and the driving line capacitance compared with the first embodiment. Therefore, the present embodiment makes it possible to achieve a stacked-type low-noise radiation detection apparatus capable of being driven at a high speed.

In the embodiment described above, the signal line 108 and the driving line 107 are formed in the organic insulating film. An inorganic insulating film may be formed on the organic insulating film to prevent the organic insulating film from being cut off during the surface polishing process. That is, by disposing the inorganic insulating film serving as a polish stopper layer on the organic insulating film, it becomes possible to improve the processing accuracy.

Third Embodiment

Figure 4:
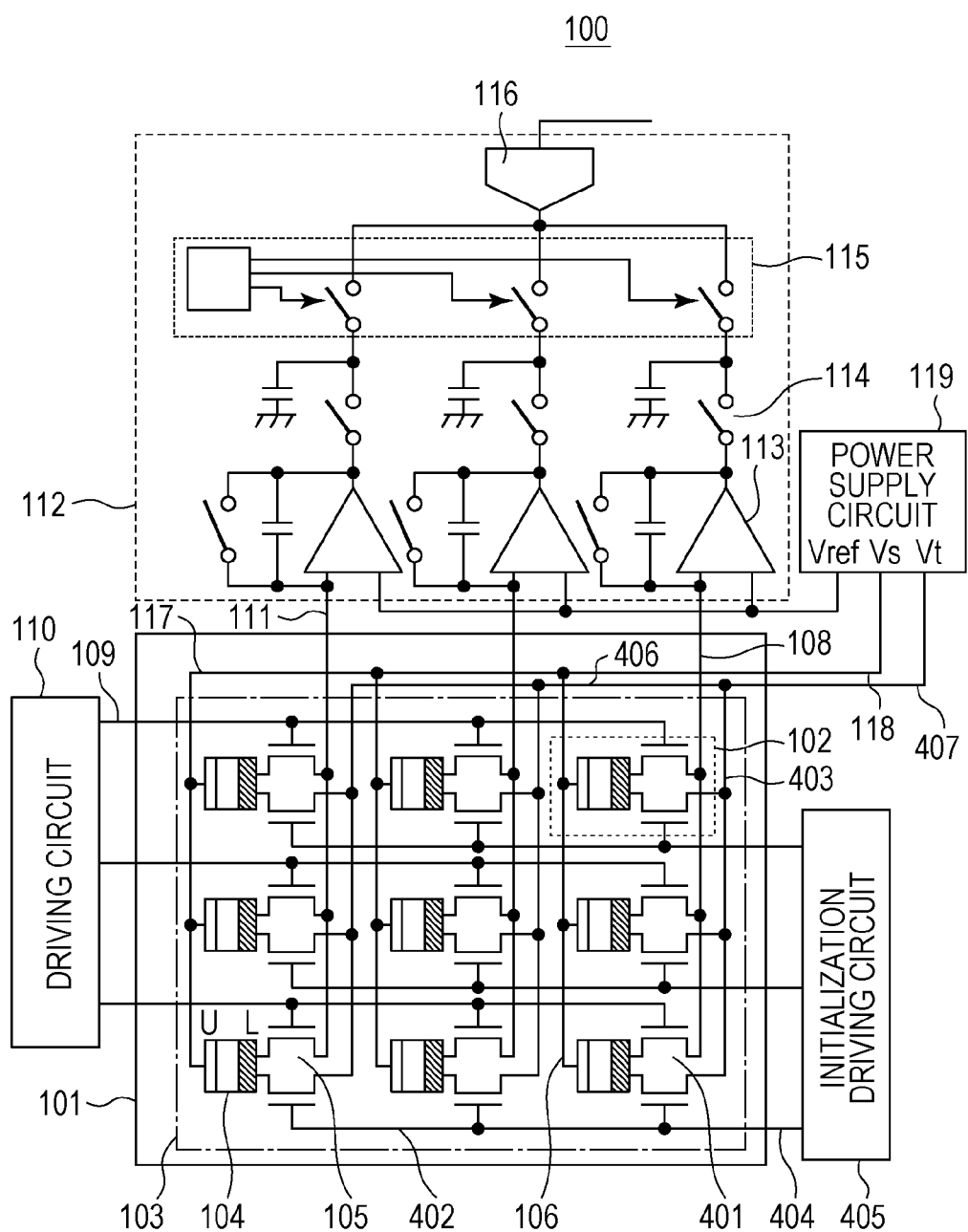
FIG. 4 illustrates a conceptual circuit diagram of a detection apparatus according to a third embodiment of the present invention.
Figure 5A:
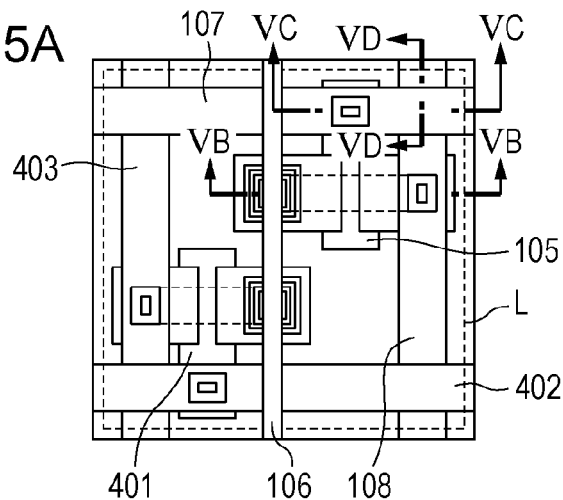
FIG. 5A is a plan view of a pixel of a detection apparatus according to the third embodiment of the present invention.
Figure 5B:
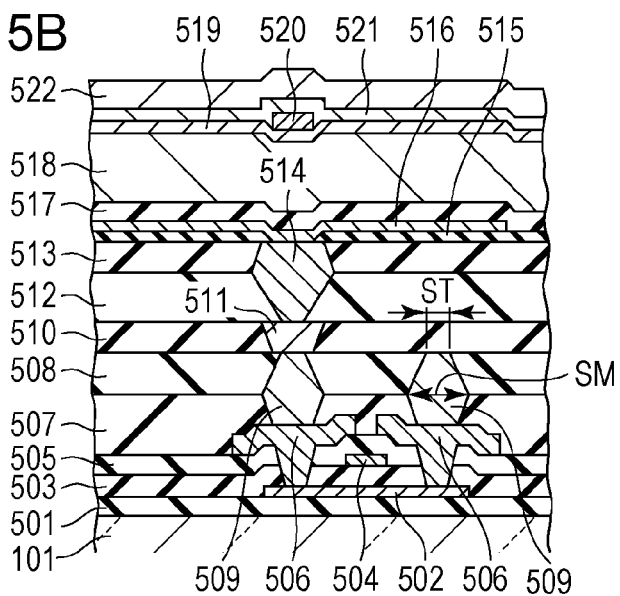
FIGS. 5B to 5D are cross-sectional views thereof.
Figure 5C:
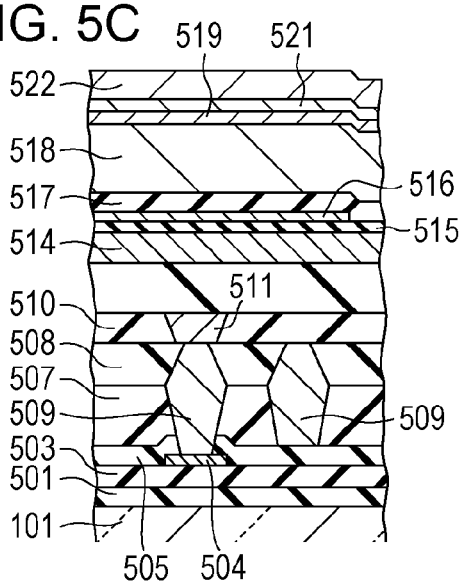
Figure 5D:
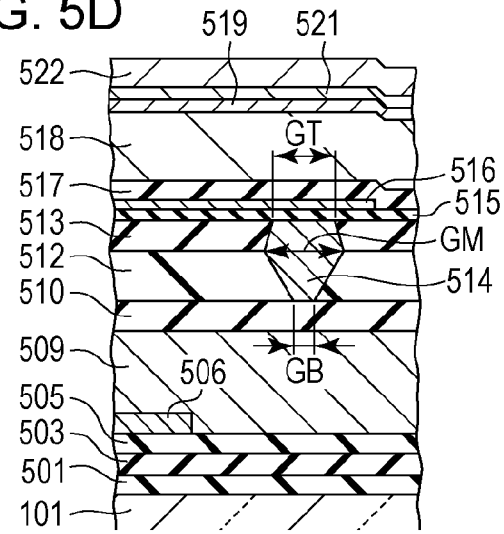

A third embodiment of the present invention is described below with reference to drawings. FIG. 4 illustrates an equivalent circuit diagram according to the third embodiment. FIG. 5A is a plan view of one pixel according to the third embodiment. FIGS. 5B to 5D are cross-sectional views taken along lines VB-VB, VC-VC, and VD-VD, respectively, of FIG. 5A. Similar elements to those in the first embodiment are denoted by similar reference numerals and a duplicated explanation thereof is omitted.

In the present embodiment, a pixel 102 further includes an initialization switch element 401 to initialize a conversion element 104. The control terminal of the initialization switch element 401 is electrically connected to the initialization driving line 402, the first main electrode of the initialization switch element 401 is electrically connected to the first electrode L of the conversion element 104, and the second main electrode of the initialization switch element 401 is electrically connected to the initialization bias line 403. Note that the initialization driving line 402 is connected in common to the control electrode of each of a plurality of initialization switch elements 401 arranged in the row direction, also electrically connected to an initialization driving circuit 405 via a fourth connection line 404. The initialization driving circuit 405 is configured to sequentially or simultaneously supply driving pulses to a plurality of initialization driving lines 402 arranged in the column direction to initialize the conversion elements 401 on a row by row basis. The initialization bias line 403 is electrically connected in common to the second main electrodes of the initialization switch elements 401 arranged in the column direction. A power supply circuit 119 is electrically connected to a plurality of initialization bias lines 403 disposed line by line in the row direction via a common initialization bias line 406 and a fifth connection line 407 such that an initialization potential Vt is supplied to the first electrode L of each conversion element 104. On the other hand, for the second electrode U of the conversion element 104, the power supply circuit 119 according to the present embodiment supplies only a bias potential Vs via the common bias line 117 and the third connection line 118.

Next, an operation of the detection apparatus according to the present embodiment is described below with reference to FIG. 4. The reference potential Vref is applied to the first electrode L of the conversion element 104 via the switch element and the bias potential Vs is applied to the second electrode U thereby biasing the conversion element such that a photoelectric conversion layer of the MIS-type photoelectric conversion element is depleted. In this state, the radiation emitted toward an object under examination passes through the object while attenuating in intensity, and is converted into visible light by a fluorescent member (not shown). The result visible light is incident on the photoelectric conversion element and is converted into an electric charge. The electric signal corresponding to the electric charge is output over the signal line 108 when the signal-output switch element 105 turns on in response to the driving pulse applied from the driving circuit 110 to the driving line 107, and the electric signal is read out as digital data by the reading circuit 112. Thereafter, the driving pulse is applied over the initialization driving line 402 from the initialization driving circuit 405 thereby turning on the initialization switch element 401. As a result, the initialization potential Vt is supplied to the first electrode L of the conversion element 104 via the initialization bias line 403. As a result of the application of the bias voltage Vs−Vt to the conversion element 104 to initialize the conversion element 104, positive or negative residual carriers are removed from the conversion element. Thereafter, the potential of the first electrode L of the conversion element 104 is switched from the initialization potential Vt to the bias potential Vref to complete the initialization of the conversion element 104. The operation described above is repeated on a row by row basis to obtain an image signal of one image. If this operation is further repeated, it is possible to obtain a moving image.

Referring FIGS. 5A to 5D, the layer structure of the pixel is described below. As shown in FIG. 5A, one pixel of the radiation detection apparatus according to the present embodiment includes a conversion element 104, a signal-output switch element 105, and an initialization switch element 401. Each pixel further includes a part of the signal line 108, a part of the driving line 107, a part of the initialization driving line 402, a part of the initialization bias line 403, and a part of the bias line 106. As shown in FIGS. 5B to 5D, the switch element 105 and the initialization switch element 401 each includes a first insulating layer 501, a first semiconductor layer 502, a second insulating layer 503, a first conductive layer 504, a third insulating layer 505, and a second conductive layer 506, which are formed on an insulating substrate 101. The first conductive layer 504 is used as a control electrode (gate electrode) of the TFT, and the second insulating layer 503 is used as a gate insulating film of the TFT. The first semiconductor layer 502 serving as a channel of the TFT is made of polysilicon. The second conductive layer 506 serves as a first or a second main electrode (a source electrode or a drain electrode).

In upper layers above the elements described above, there are disposed a fourth insulating layer 507 and a fifth insulating layer 508. A third conductive layer 509 used as the signal line 108 and the initialization bias line 403 is formed in the fourth insulating layer 507 and the fifth insulating layer 508. The second conductive layer 506 serving as the second main electrode of the switch element 105 and the second main electrode of the initialization switch element 401 is connected to the third conductive layer 509 used as the signal line 108 and the initialization bias line 403. The fourth insulating layer 507 is formed using an organic insulating film having positive-type photosensitivity, and the fifth insulating layer 508 is formed using an organic insulating film having negative-type photosensitivity. In the structure obtained via the above-described process, if the width of the upper part of the signal line 108 and the initialization bias line 403 is denoted by ST and the maximum width thereof is denoted by ST and SM, then ST<SM.

In an upper layer above the elements described above, there is disposed a sixth insulating layer 510 formed using an organic insulating film having positive photosensitivity, and a fourth conductive layer 511 is embedded in the sixth insulating layer 510. In still upper layers, there are disposed a seventh insulating layer 512 and an eighth insulating layer 513. A fifth conductive layer 514 used as the driving line 107 or initialization driving line 402 is formed in the seventh insulating layer 512 and the eighth insulating layer 513. The seventh insulating layer 512 is formed using an organic insulating film having positive photosensitivity, and the eighth insulating layer 513 is formed using an organic insulating film having negative photosensitivity. In the structure obtained via the above-described process, if the width of the upper part of the driving line 107 and the initialization driving line 402 is denoted by GT, the width of the lower part thereof is denoted by GB, and the maximum width thereof is denoted by GM, then GB<GM and GT<GM. The fourth conductive layer 511 serves as a connection electrode that connects the second conductive layer 506 serving as the first main electrode of the switch element 105 or the initialization switch element 401 to the sixth conductive layer 516 serving as the second electrode L of the conversion element 104. The fourth conductive layer 511 also serves as a connection electrode that connects the first conductive layer 504 serving as the control electrode of the switch element 105 or the initialization switch element 401 to the fifth conductive layer 514 serving as the driving line 107 or the initialization driving line 402.

In upper layers above the elements described above, a ninth insulating layer 515 is formed, and furthermore a MIS-type photoelectric conversion element serving as the conversion element 104 is formed on the ninth insulating layer 515. The MIS-type photoelectric conversion element includes a sixth conductive layer 516, a tenth insulating layer 517, a second semiconductor layer 518, an impurity semiconductor layer 519, and an eighth conductive layer 521. The sixth conductive layer 516 serves as a lower electrode (first electrode L) of the photoelectric conversion element. The tenth insulating layer 517 serves as a perfect insulating layer for blocking positive and negative generated carriers from moving. The second semiconductor layer 518 serves as a photoelectric conversion layer that converts a radiation or light into an electric charge. The impurity semiconductor layer 519 serves as a blocking layer that blocks positive or negative carriers from moving. The eighth conductive layer 521 serves as an upper electrode (second electrode U). The seventh conductive layer 520 serves as the bias line 106. The upper electrode (second electrode U) realized using the eighth conductive layer 521 serves to apply a bias voltage to the whole conversion element 104, wherein the bias voltage is equal to the difference between a bias potential Vs supplied via the bias line 106 and a reference potential Vref or an initialization potential Vt supplied to the first electrode L.

As described above, by forming lines in a plurality of insulating layers having positive or negative photosensitivity, it is possible to easily control the shape of each line. This makes it possible to reduce the signal line capacitance. Furthermore, in the present embodiment, because the driving line 107 is formed such that the upper-part width GT is smaller than the maximum width GM, the overlapping area between the driving line and the lower electrode (first electrode L) of the conversion element is reduced compared with that according to the first or second embodiment. As a result, a reduction in capacitance is achieved at the intersection between the driving line and the conversion element. Thus, it is possible to reduce the time constant of the driving line given by the product of the resistance and the capacitance, and thus the high-speed driving capability is achieved.

Fourth Embodiment

Figure 6:
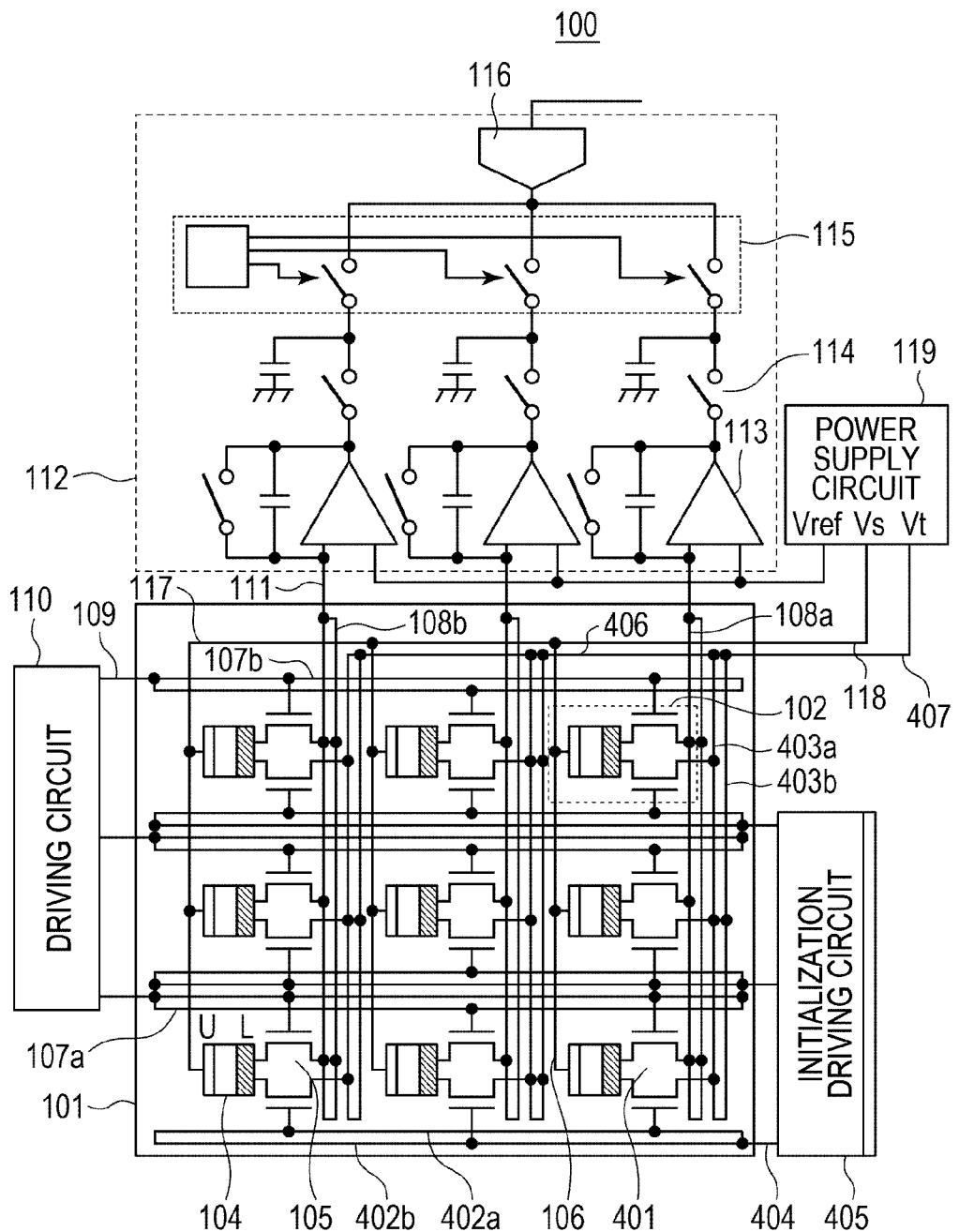
FIG. 6 illustrates a conceptual circuit diagram of a detection apparatus according to a fourth embodiment of the present invention.
Figure 7A:
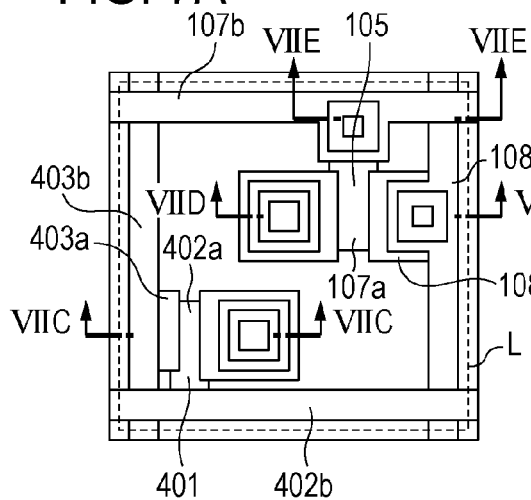
FIGS. 7A and 7B are plan views each illustrating a pixel in a detection apparatus according to the fourth embodiment of the present invention.
Figure 7B:
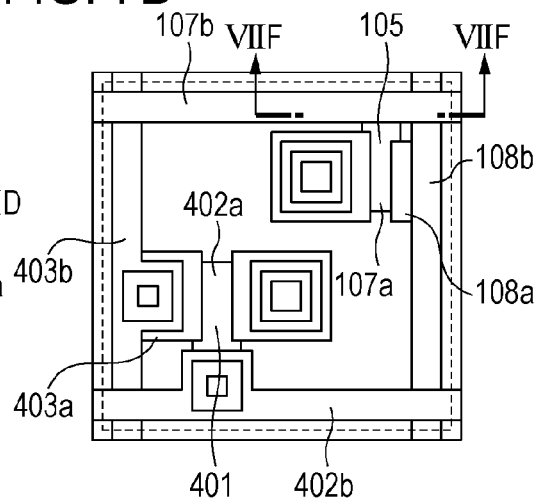
Figure 7C:
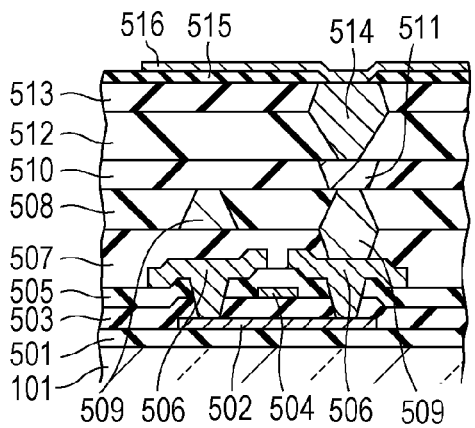
FIGS. 7C to 7E are cross-sectional views taken along particular lines of FIG. 7A.
Figure 7D:
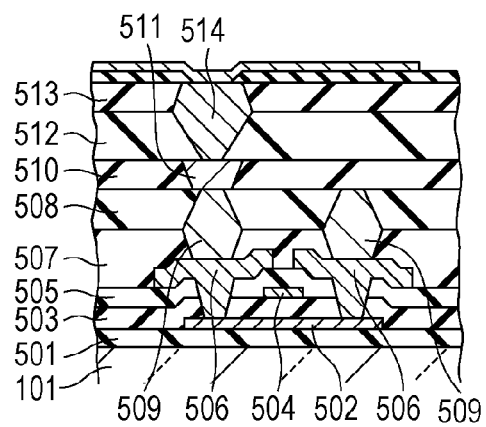
Figure 7E:
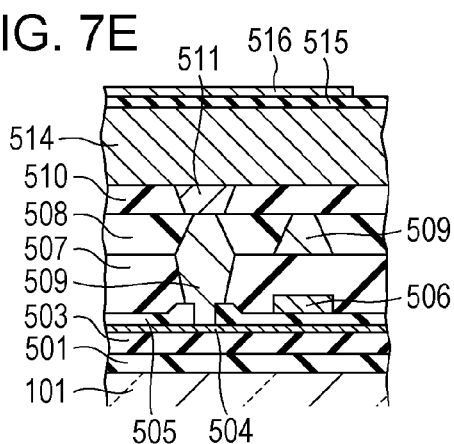
Figure 7F:
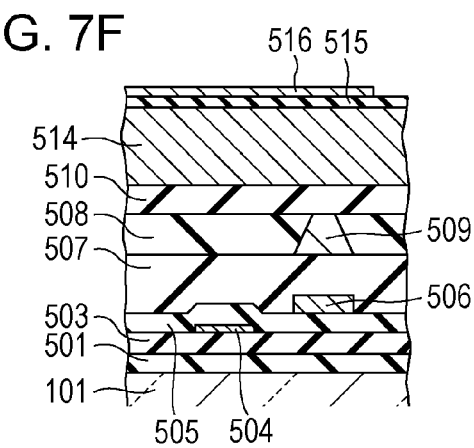
FIG. 7F is a cross-sectional view taken along a line of FIG. 7B.

A fourth embodiment of the present invention is described below with reference to drawings. FIG. 6 illustrates an equivalent circuit diagram according to the fourth embodiment. FIGS. 7A and 7B are plan views each illustrating a pixel, FIGS. 7C to 7E are cross-sectional views taken along lines VIIC-VIIC, VIID-VIID, and VIIE-VIIE, respectively, of FIG. 7A, and FIG. 7F is a cross-sectional view taken along a line VIIF-VIIF of FIG. 7B. Similar elements to those in the third embodiment are denoted by similar reference numerals and a duplicated explanation thereof is omitted.

In the radiation detection apparatus according to the present embodiment, the pixel pitch is further reduced compared with that in the third embodiment. If the line width is reduced to achieve the small pixel pitch, the result is increase in the ratio of the area occupied by connection holes in one pixel to the total area. This can produce a possibility that a connection hole for a signal-output switch element overlaps a connection hole for an initialization switch element. Note that the connection hole refers to a hole via which to connect an electrode of a switch element to a line.

In the present embodiment, to solve the above problem, first pixels A shown in FIG. 7A and second pixels B shown in FIG. 7B are alternately disposed. Note that the second pixel B has a layout pattern equivalent to a pattern obtained by rotating the pattern of the first pixel A by 180°. The layer structure is similar to that according to the third embodiment, but locations of connection holes and line structures are different from those according to the third embodiment.

The differences from the third embodiment are described in detail below. In the present embodiment, the signal line 108 in each column includes a first signal line 108a realized by the second conductive layer 506 and a second signal line 108b realized by the third conductive layer 509 embedded in the fifth insulating layer 508. The initialization bias line 403 in each column includes a first initialization bias line 403a realized by the second conductive layer 506 and a second initialization bias line 403b realized by the third conductive layer 509 embedded in the fifth insulating layer 508. The third conductive layer 509 embedded in the fourth insulating layer 507 forms a connection hole. The driving line 107 in each row includes a first driving line 107a realized by the first conductive layer 504 and a second driving line 107b realized by the fifth conductive layer 514. The initialization driving line 402 in each row includes a first initialization driving line 402a realized by the first conductive layer 504 and a second initialization driving line 402b realized by the fifth conductive layer 514. For those, the third conductive layer 509 and the fourth conductive layer 511 form connection holes.

The first pixel A includes a connection hole for connecting the control electrode of the signal-output switch element 105 to the second driving line 107b and a connection hole for connecting the second main electrode to the second signal line 108b. Thus, the control electrode of the switch element 105 is connected to both the first driving line 107a and the second driving line 107b, and the second main electrode is connected to both the first signal line 108a and the second signal line 108b. However, there is no connection hole for connecting the control electrode of the initialization switch element 401 to the second initialization driving line 402b, and there is no connection hole for connecting the second main electrode to the second initialization bias line 403b. Thus, the control electrode of the initialization switch element 401 is connected only to the first initialization driving line 402a, and the second main electrode is connected only to the first initialization bias line 403a. In contrast, the second pixel B does not include a connection hole for connecting the control electrode of the signal-output switch element 105 to the second driving line 107b and a connection hole for connecting the second main electrode to the second signal line 108b. Thus, the control electrode of the switch element 105 is connected only to the first driving line 107a and the second main electrode is connected only to the first signal line 108a. On the other hand, there is a connection hole for connecting the control electrode of the initialization switch element 401 to the second initialization driving line 402b and there is a connection hole for connecting the second main electrode to the second initialization bias line 403b. Thus, the control electrode of the initialization switch element 401 is connected to both the first initialization driving line 402a and the second initialization driving line 402b, and the second main electrode is connected to both the first initialization bias line 403a and the second initialization bias line 403b. That is, the present embodiment is different from the third embodiment in that the two types of pixels different in layout of connection holes are disposed alternately.

By arranging the pixels A and the pixels B alternately as described above, it becomes possible to reduce the number of connection holes per pixel. This makes it possible to dispose a plurality of switch elements in each pixel even in a case where the pixel pitch is further reduced. Furthermore, in the present embodiment, as in the third embodiment, it is possible to further reduce the capacitance and the resistance of the signal lines and the driving lines, which makes it possible to realize a stacked-type low-noise radiation detection apparatus capable of being driven at a high speed. Although in the present embodiment two types of pixels are alternately arranged, the number of pixel types is not limited to two. Three or more types of pixels different in layout of connection holes may be combined to achieve similar advantages.

Fifth Embodiment

Figure 8:
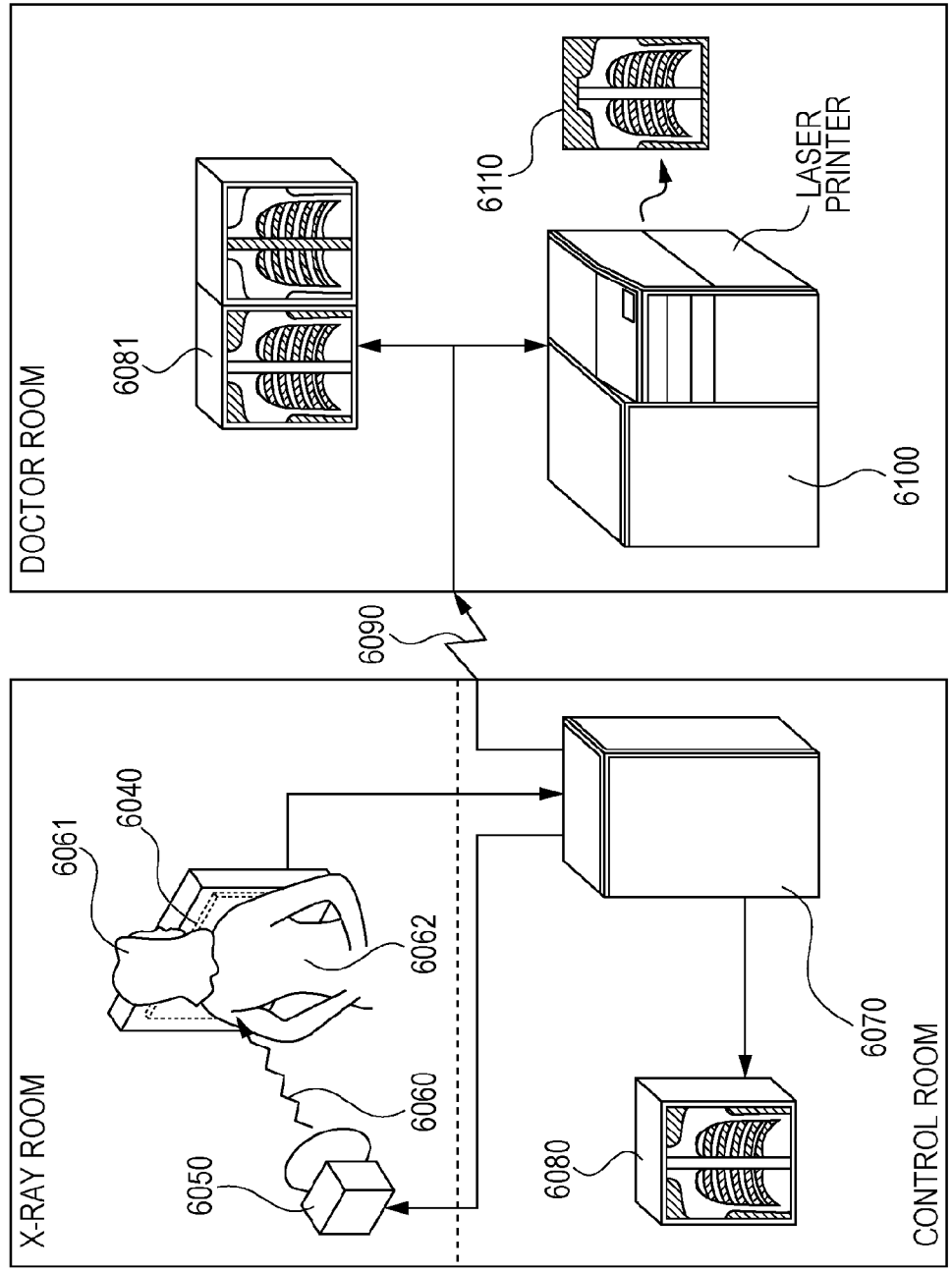
FIG. 8 illustrates and exemplary radiation detection system equipped with a radiation detection apparatus according to an embodiment of the present invention.

FIG. 8 illustrates an example of a radiation detection system using a radiation detection apparatus according to an embodiment of the present invention.

In the radiation detection system shown in FIG. 8, an X-ray 6060 generated by an X-ray tube 6050 serving as a radiation source passes through a chest 6062 of a patient or a subject 6061 under examination and is incident on a radiation detection apparatus 6040 having a fluorescent member disposed on the top. The X-ray incident on the photoelectric conversion apparatus 6040 includes information on the inside of the body of the patient 6061. In response to the incident X-ray, the fluorescent member emits light. The emitted light is converted into electric information. The electric information is converted into a digital signal and is subjected to image processing by an image processor 6070 serving as a signal processing unit. A resultant image is displayed on a display 6080 serving as a display unit installed in a control room.

The obtained information may be transferred from the signal processing unit to a remote location by a transmitting unit using a network connection such as a telephone line 6090, so that the information may be displayed on a display 6081 serving as a display unit installed in a doctor room at the remote location or may be stored in a storage medium such as an optical disk. This allows a doctor at the remote location to make a diagnosis. The information may be recorded on a film 6110 serving as a recording medium by a film processor 6100 serving as a recording unit.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-176365 filed Aug. 5, 2010, which is hereby incorporated by reference herein in its entirety.

What is claimed is:

1. A detection apparatus comprising:
a plurality of pixels arranged in a row direction and a column direction on an insulating substrate, each pixel including a conversion element configured to convert radiation or light into an electric charge and a switch element disposed on the insulating substrate and configured to output an electric signal corresponding to the electric charge, the conversion element being disposed above the switch element;
a driving line disposed below the conversion element and connected to each of the switch elements arranged in the row direction; and
a signal line connected to each of the switch elements arranged in the column direction,
wherein the signal line includes a conductive layer embedded in an insulating member, and the insulating member being disposed in a layer lower than an uppermost surface portion of the driving line.

2. The detection apparatus according to claim 1, further comprising a plurality of insulating layers disposed between the conversion element and the switch element, wherein
the insulating member includes an insulating layer that is one of the plurality of insulating layers and that is located lower the uppermost surface portion of a conductive layer serving as the driving line located below the conversion element.

3. The detection apparatus according to claim 2, wherein
the switch element includes a first conductive layer disposed on the insulating substrate, a first insulating layer disposed on the first conductive layer, a first semiconductor layer disposed on the first insulating layer, a first impurity semiconductor layer disposed on the first semiconductor layer, and a second conductive layer disposed on the first impurity semiconductor layer,
the signal line includes a third conductive layer that is embedded in a second insulating layer disposed on the switch element and in a third insulating layer disposed on the second insulating layer and that is connected to the switch element,
the driving line includes a fifth conductive layer embedded in a fifth insulating layer formed on a fourth insulating layer, the fifth conductive layer being connected to the switch element via the third conductive layer and a fourth conductive layer embedded in the fourth insulating layer disposed on the third insulating layer, and
the conversion element includes a seventh conductive layer serving as a lower electrode disposed via a sixth insulating layer on the fifth insulating layer and connected to the switch element via the third conductive layer, the fourth conductive layer, and the fifth conductive layer.

4. The detection apparatus according to claim 2, wherein each pixel further includes an initialization switch element to initialize the conversion element,
and wherein the detection apparatus further includes
an initialization driving line connected to a plurality of initialization switch elements arranged in the row direction, and
an initialization bias line connected to a plurality of initialization switch element arranged in the column direction.

5. The detection apparatus according to claim 4, wherein
the switch element includes a first insulating layer disposed on the insulating substrate, a first semiconductor layer disposed on the first insulating layer, a second insulating layer disposed on the first insulating layer, a first conductive layer disposed on the second insulating layer, a third insulating layer disposed on the first conductive layer, and a second conductive layer disposed on the third insulating layer, the signal line includes a third conductive layer embedded in a fifth insulating layer on a fourth insulating layer disposed on the switch element, and the driving line includes a fifth conductive layer embedded in a seventh insulating layer disposed on a sixth insulating layer and connected to the switch element via the third conductive layer and a fourth conductive layer embedded in the sixth insulating layer disposed on the fifth insulating layer.

6. The detection apparatus according to claim 5, wherein the fifth conductive layer is further embedded in an eighth insulating layer disposed on the seventh insulating layer, and the conversion element includes a sixth conductive layer serving as a lower electrode disposed via a ninth insulating layer on the eighth insulating layer and connected to the switch element via the third conductive layer, the fourth conductive layer, and the fifth conductive layer.

7. The detection apparatus according to claim 5, wherein the initialization bias line includes the third conductive layer, and the initialization driving line includes the fifth conductive layer connected to the switch element via the third conductive layer and the fourth conductive layer.

8. The detection apparatus according to claim 7, wherein the plurality of pixels include first pixel and second pixel, the signal line includes a first signal line including the second conductive layer and a second signal line including the third conductive layer, the driving line includes a first driving line including the first conductive layer and a second driving line including the fifth conductive layer, the initialization bias line includes a first initialization bias line including the second conductive layer and a second initialization bias line including the third conductive layer, the initialization driving line includes a first initialization driving line including the first conductive layer and a second initialization driving line including the fifth conductive layer, the switch element of the first pixel including a control electrode connected to both the first driving line and the second driving line and a main electrode connected to both the first signal line and the second signal line, the initialization switch element of the first pixel including a control electrode connected only to the first initialization driving line and a main electrode connected only to the first initialization bias line, and the switch element of the second pixel including a control electrode connected only to the first driving line and a main electrode connected only to the first signal line, the initialization switch element of the second pixel including a control electrode connected to both the first initialization driving line and the second initialization driving line and a main electrode connected to both the first initialization bias line and the second initialization bias line.

9. The detection apparatus according to claim 1, wherein, when a width of an upper portion of the signal line is denoted by ST and a maximum width thereof is denoted by SM, the following condition is satisfied, $$ST<SM.$$

10. The detection apparatus according to claim 1, wherein, when a width of a lower portion of the driving line is denoted by GB and a maximum width thereof is denoted by GM, the following condition is satisfied, $$GB<GM.$$

11. A radiation detection system comprising:
the detection apparatus according to claim 1;
a signal processing unit configured to process a signal supplied from the detection apparatus;
a storage unit configured to store a signal supplied from the signal processing unit;
a display unit configured to display the signal supplied from the signal processing unit;
a transmitting unit configured to transmit the signal supplied from the signal processing unit; and
a radiation source configured to generate the radiation.

* * * * *